(12) United States Patent
Cai et al.

(10) Patent No.: US 8,735,272 B2
(45) Date of Patent: May 27, 2014

(54) INTEGRATED CIRCUIT HAVING A REPLACEMENT GATE STRUCTURE AND METHOD FOR FABRICATING THE SAME

(75) Inventors: Xiuyu Cai, Albany, NY (US); Ruilong Xie, Albany, NY (US); Kangguo Cheng, Albany, NY (US); Ali Khakifirooz, Mountain View, CA (US)

(73) Assignees: Globalfoundries, Inc., Grand Cayman (KY); International Business Machines, Armonk, NY (US)

( * ) Notice: Subject to any disclaimer, the term of this patent is extended or adjusted under 35 U.S.C. 154(b) by 0 days.

(21) Appl. No.: 13/562,659

(22) Filed: Jul. 31, 2012

(65) Prior Publication Data
US 2014/0035010 A1 Feb. 6, 2014

(51) Int. Cl.
*H01L 21/4763* (2006.01)
(52) U.S. Cl.
USPC ........... 438/595; 438/183; 438/184; 438/303; 257/288; 257/369; 257/410
(58) Field of Classification Search
USPC .......... 438/595, 183–184, 303; 257/288, 369, 257/410, E27.062, E21.19
See application file for complete search history.

(56) References Cited

U.S. PATENT DOCUMENTS

2013/0005148 A1* 1/2013 Sonoda et al. ................ 438/692
2013/0221413 A1* 8/2013 Jagannathan et al. ........ 257/288

* cited by examiner

*Primary Examiner* — Theresa T Doan
(74) *Attorney, Agent, or Firm* — Ingrassia Fisher & Lorenz, P.C.

(57) ABSTRACT

A method for fabricating an integrated circuit includes forming a temporary gate structure on a semiconductor substrate. The temporary gate structure includes a temporary gate material disposed between two spacer structures. The method further includes forming a first directional silicon nitride liner overlying the temporary gate structure and the semiconductor substrate, etching the first directional silicon nitride liner overlying the temporary gate structure and the temporary gate material to form a trench between the spacer structures, while leaving the directional silicon nitride liner overlying the semiconductor substrate in place, and forming a replacement metal gate structure in the trench. An integrated circuit includes a replacement metal gate structure overlying a semiconductor substrate, a silicide region overlying the semiconductor substrate and positioned adjacent the replacement gate structure; a directional silicon nitride liner overlying a portion of the replacement gate structure; and a contact plug in electrical communication with the silicide region.

19 Claims, 9 Drawing Sheets

INTEGRATED CIRCUIT HAVING A REPLACEMENT GATE STRUCTURE AND METHOD FOR FABRICATING THE SAME

TECHNICAL FIELD

Embodiments of the subject matter described herein relate generally to integrated circuits and methods for fabricating the same. More particularly, the subject matter relates to integrated circuits and methods for fabricating integrated circuits having a replacement gate structure.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. Such fabrication techniques may degrade the metal gate electrode or cause interaction with the gate dielectric, thereby adversely impacting transistor performance.

Replacement gate techniques have been developed to address problems attendant upon substituting metal gate electrodes for polysilicon gate electrodes. For example, a polysilicon gate is used during initial processing until high temperature annealing to activate source/drain implants has been implemented. Subsequently, the polysilicon is removed and replaced with a metal gate.

Additional issues arise with lateral scaling, such as the formation of contacts. For example, once the contacted gate pitch gets to about 70 nanometers (nm) or below, there is not enough room to land a contact between the gate lines and still maintain reliable electrical isolation properties between the gate line and the contact. Various self-aligned contact (SAC) methodologies have been developed to address this problem. To realize a SAC compatible with replacement gate techniques, two nitride liners are required to be present in the gate structure for the purpose of blocking ionic diffusion from an interlayer dielectric (ILD) oxide material layer, which is typically present adjacent to the gates, during chemical mechanical planarization (CMP) steps, which are often used during the replacement gate forming process. Conformal atomic layer deposition (ALD) methods are currently used to deposit these nitride liners. However, ALD reduces the space available for SAC opening between gates. As such, these current methodologies do not provide enough space between gates to allow for SAC formation therebetween.

A need therefore exists for an improved methodology enabling the fabrication of semiconductor devices including integrating both metal replacement gates and self-aligned contacts for small-scale architectures. Further, there exists a need for an improved methodology enabling the fabrication of semiconductor devices that provide more space for contacts in devices with a small gate pitch. Still further, other desirable features and characteristics of the present invention will become apparent from the subsequent detailed description of the invention and the appended claims, taken in conjunction with the accompanying drawings, the brief summary, and this background of the invention.

BRIEF SUMMARY

Methods of fabricating integrated circuits are provided herein. In an exemplary embodiment, a method for fabricating an integrated circuit includes forming a temporary gate structure on a semiconductor substrate. The temporary gate structure includes a temporary gate material disposed between two spacer structures. The method further includes forming a first directional silicon nitride liner overlying the temporary gate structure and the semiconductor substrate, etching the first directional silicon nitride liner overlying the temporary gate structure and the temporary gate material to form a trench between the spacer structures, while leaving the directional silicon nitride liner overlying the semiconductor substrate in place, and forming a replacement metal gate structure in the trench. The replacement metal gate structure includes a work function material and a conductive material. Still further, the method includes forming a contact adjacent to the replacement metal gate structure.

In another exemplary embodiment, a method for fabricating an integrated circuit includes forming a temporary gate structure on a semiconductor substrate, the temporary gate structure including a temporary gate material disposed between two spacer structures, forming a first directional silicon nitride liner overlying the temporary gate structure and the semiconductor substrate, and etching the first directional silicon nitride liner overlying the temporary gate structure and the temporary gate material to form a trench between the spacer structures, while leaving the directional silicon nitride liner overlying the semiconductor substrate in place. The method further includes forming a replacement metal gate structure in the trench, the replacement metal gate structure including a work function material and a conductive material, etching the first directional silicon nitride liner overlying the semiconductor substrate after forming the replacement metal gate structure, and forming a silicide region adjacent the gate structure. Still further, the method includes forming a second directional silicon nitride liner overlying the replacement metal gate structure and the silicide region and forming a contact to the silicide region by etching at least a portion of the directional silicon nitride liner overlying the silicide region.

In yet another exemplary embodiment, an integrated circuit includes a replacement metal gate structure overlying a semiconductor substrate and a silicide region overlying the semiconductor substrate and positioned adjacent the replacement metal gate structure. The integrated circuit further includes a directional silicon nitride liner overlying the replacement metal gate structure and a contact plug in electrical communication with the silicide region.

BRIEF DESCRIPTION OF THE DRAWINGS

The disclosed embodiments will hereinafter be described in conjunction with the following drawing figures, wherein like numerals denote like elements, and wherein.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor-based integrated circuits are well known and so, in the interest of brevity, many conventional steps will only be mentioned briefly herein or will be omitted entirely without providing the well-known process details.

The techniques and technologies described herein may be utilized to fabricate MOS integrated circuit devices, including NMOS integrated circuit devices, PMOS integrated circuit devices, and CMOS integrated circuit devices. In particular, the process steps described here can be utilized in conjunction with any semiconductor device fabrication process that forms gate structures for integrated circuits, including both planar and non-planar integrated circuits. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

Figure 1:
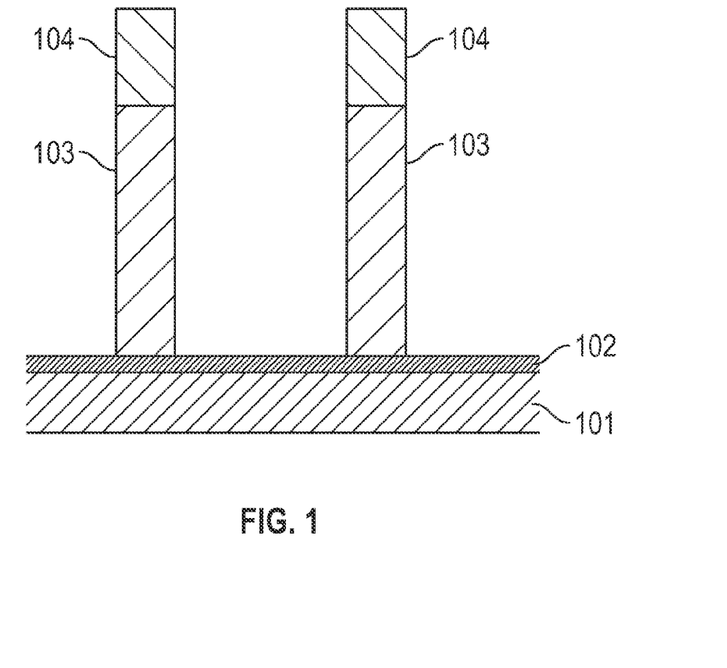
FIGS. 1-18 are partial cross-section views of an integrated circuit illustrating methods for fabricating an integrated circuit having a replacement gate structure and self-aligned contacts in accordance with one embodiment of the present disclosure.

With reference to FIG. 1, in one embodiment, depicted is a cross-sectional view of a partially-formed integrated circuit (IC) prior to forming the replacement gate structure therein. In particular, FIG. 1 depicts the fabrication state of a semiconductor device structure after formation of "dummy" gate structures 103 overlying a layer of semiconductor material 101, and a thin layer of dummy oxide material 102, such as silicon oxide, which is provided as a gate insulator. FIG. 1 represents a view from a cross-section taken through the major longitudinal axes of the dummy gate structures 103. Although two dummy gate structures 103 are shown in FIG. 1 (and the other figures), the device structure could include any number, including only one. The device structure is formed using well known techniques and process steps (e.g., techniques and steps related to doping, photolithography and patterning, etching, material growth, material deposition, surface planarization, and the like) that will not be described in detail here.

The semiconductor material 101 is preferably a silicon material as typically used in the semiconductor industry, e.g., relatively pure silicon as well as silicon admixed with other elements such as germanium, carbon, and the like. Alternatively, the semiconductor material 101 can be germanium, gallium arsenide, or the like. The semiconductor material 101 can be either N-type or P-type, but is typically P-type, with wells of the appropriate type formed therein. The semiconductor material 101 may be provided as a bulk semiconductor substrate, or it could be provided on a silicon-on-insulator (SOI) substrate, which includes a support substrate, an insulator layer on the support substrate, and a layer of semiconductor material on the insulator layer.

Overlying each dummy gate structure 103 is a sacrificial hard mask cap 104. This hard mask cap 104, which may be formed from a nitride, a silicide, or other material, is used as part of an etch mask during the formation of the dummy gate structures 103.

The material used for the gate insulator layer 102 can be a layer of thermally grown silicon oxide as noted above, such as silicon dioxide. In alternative embodiments, the layer 102 can be a deposited insulator such as a silicon oxide, silicon nitride, any kind of high-k oxide such as hafnium oxides, or the like. Deposited insulators can be deposited, for example, by chemical vapor deposition (CVD), atomic layer deposition (ALD), low pressure chemical vapor deposition (LPCVD), or plasma enhanced chemical vapor deposition (PECVD). The gate insulator material preferably has a thickness of about 1-10 nm, although the actual thickness can be determined based on the application of the transistor in the circuit being implemented. The material for the dummy gate structure 103 is formed overlying the gate insulator material. In accordance with certain embodiments, the material used for the dummy gate structure 103 is polycrystalline silicon, although other replaceable materials could be used instead of polycrystalline silicon. The layer of polycrystalline silicon is preferably deposited, e.g., using LPCVD by the hydrogen reduction of silane. Typically, the polycrystalline silicon will have a thickness within the range of about 50-100 nm. Thereafter, the polycrystalline silicon is etched using the hard mask caps 104 as an appropriate etch mask. In an embodiment, reactive ion etching (RIE) may be employed as a suitable anisotropic etch technique.

Figure 2:
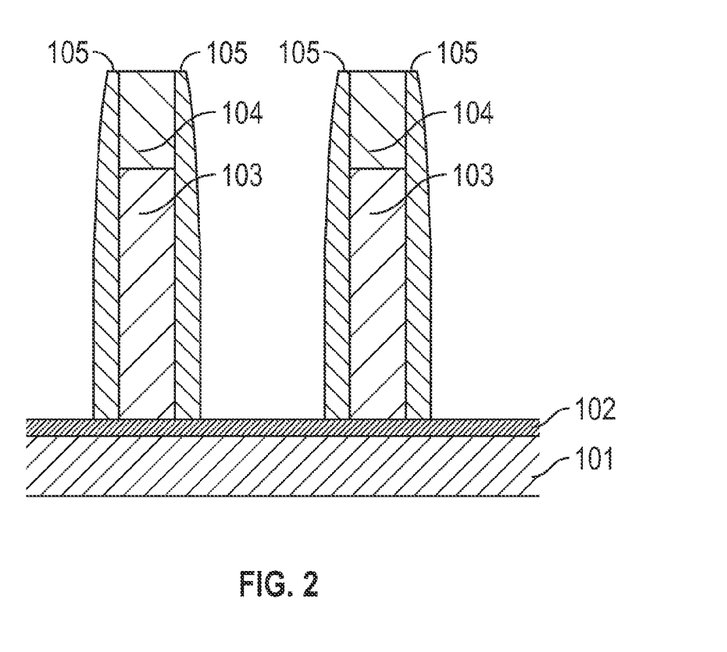

With reference now to FIG. 2, spacer structures 105 are fabricated on either side of the dummy gate 103 and hard mask cap 104 in a conventional manner. In this regard, the spacers 105 can be created by conformally depositing a dielectric material over the wafer, where the dielectric material is an appropriate insulator, such as silicon nitride. The dielectric spacer material can be deposited in a known manner by, for example, atomic layer deposition (ALD), CVD, LPCVD, semi-atmospheric chemical vapor deposition (SACVD), or PECVD. The layer of dielectric spacer material is deposited to a thickness so that, after anisotropic etching, the spacers 105 formed from the layer have a thickness that is appropriate for any subsequent process steps. In typical implementations, the layer of dielectric spacer material is deposited to a thickness of about 5-50 nm. The process continues, in accordance with an exemplary embodiment, with anisotropic etching of the layer of dielectric spacer material to form the spacers 105, as illustrated in FIG. 2. The layer of dielectric spacer material can be etched by, for example, reactive ion etching (RIE) using a suitable etching chemistry.

Figure 3:
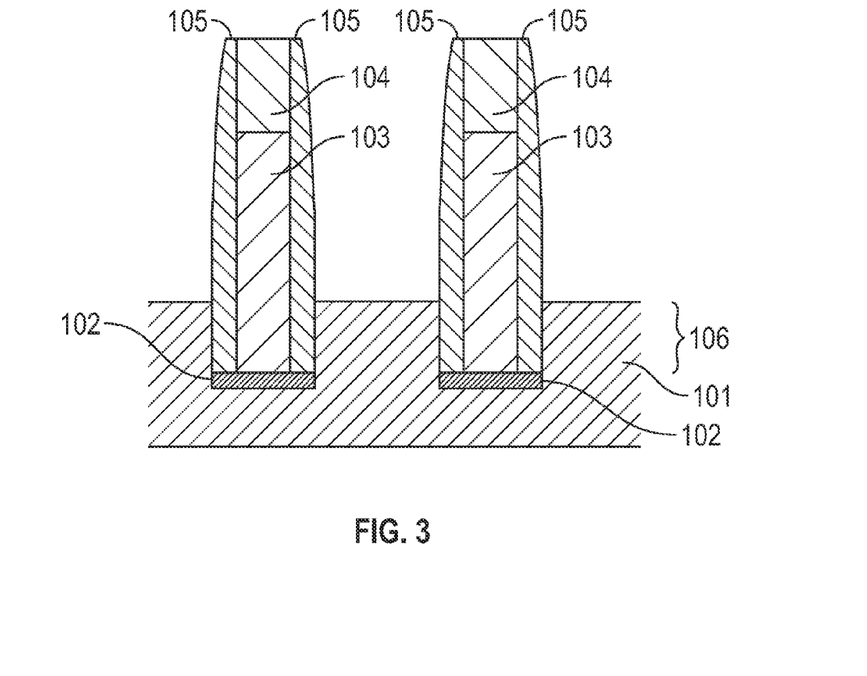

The spacers 105 can be used to protect the underlying semiconductor material during ion implantation associated with the formation of source/drain extension implants, halo implants, and/or deep source/drain implants, as is well understood. As such, as disclosed in FIG. 3, the method continues with the formation of source/drain regions 106, by conventional processes, such as epitaxially, for example of SiGe and/or SiC, on substrate 101 at opposite sides of each gate 103, and thereafter appropriately doped.

Figure 4:
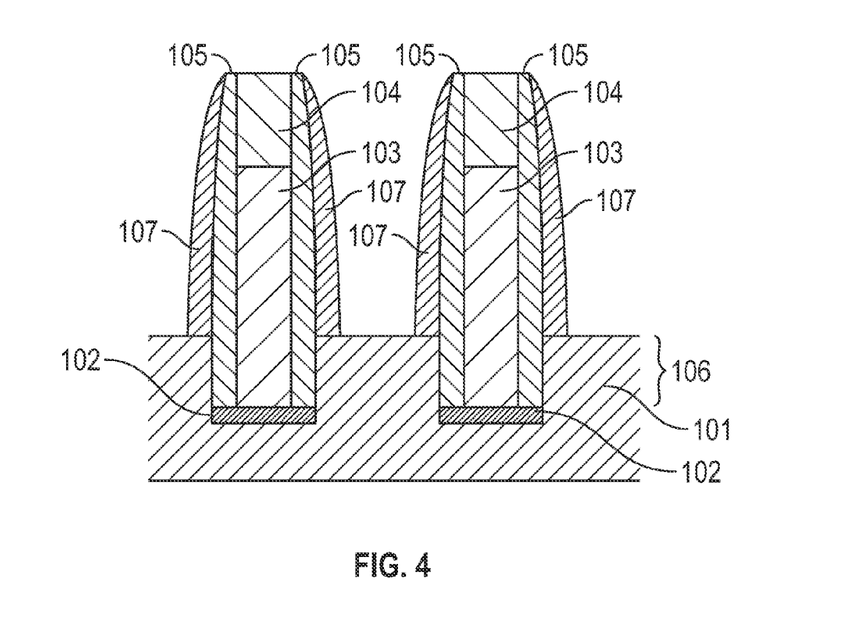

With reference now to FIG. 4, additional spacer structures 107 are fabricated on either side of the spacers 105 in a conventional manner. In this regard, the spacers 107 can be created by conformally depositing a dielectric material over the wafer, where the dielectric material is an appropriate insulator, such as a silicon oxide. The dielectric spacer material can be deposited in a known manner by, for example, atomic layer deposition (ALD), CVD, LPCVD, semi-atmospheric chemical vapor deposition (SACVD), or PECVD. It is noted that this layer will be deposited over the source/drain regions 106. The layer of dielectric spacer material is deposited to a thickness so that, after anisotropic etching, the spacers 107 formed from the layer have a thickness that is appropriate for any subsequent process steps. In typical implementations, the layer of dielectric spacer material is deposited to a thickness of about 5-50 nm. The process continues, in accordance with an exemplary embodiment, with anisotropic etching of the layer of dielectric spacer material to form the spacers 107, as illustrated in FIG. 4. The layer of dielectric spacer material can be etched by, for example, reactive ion etching (RIE) using a suitable etching chemistry.

Figure 5:
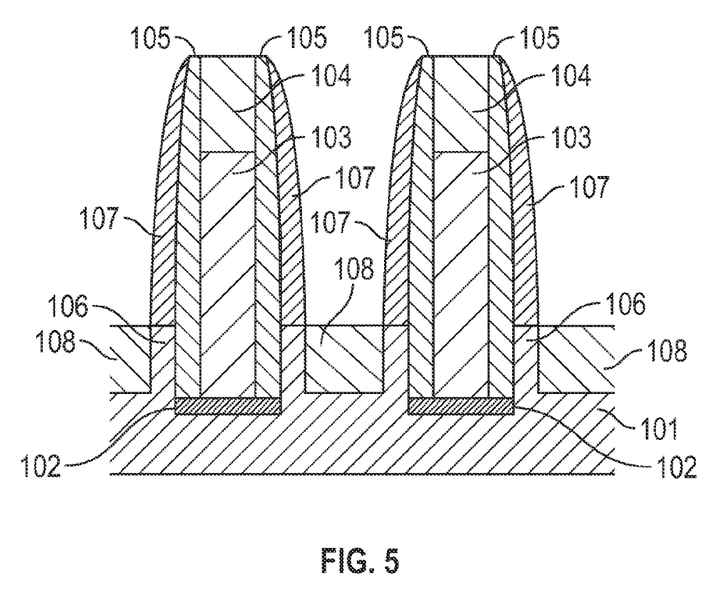

With reference now to FIG. 5, source and drain implants are performed in the region 108. These implants are substantially blocked by the sidewall spacers 107, which as noted above were provided over the source/drain regions 106. Accordingly, the sidewall spacers 107 act as a boundary that guides the dopants into source and drain regions 106 of the substrate. The implants are spaced apart from the dummy gates by the width of the spacers 107. By way of example, a dopant of boron, arsenic or phosphorous or other suitable dopant may be implanted at an energy level of about 3 to 50 KeV to provide dopant to an implant range into silicon of about 200-5000 Angstroms, for example.

Figure 6:
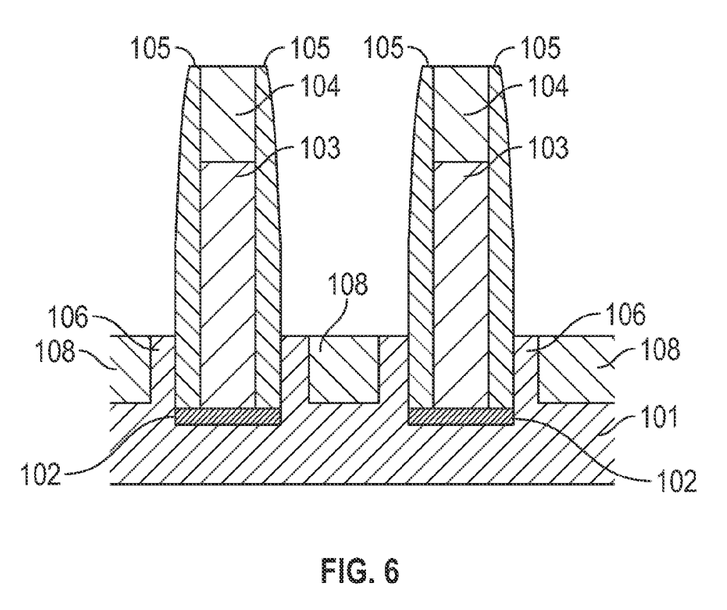

Referring now to FIG. 6, the outer spacers 107 are removed or pulled back. In one embodiment, removal of the spacers 107 removes any spacer material overlaying the source/drain regions 106. In one embodiment, removal of the spacers is achieved with an anisotropic or isotropic etch, such as RIE or dry etch. Preferably, the spacer 107 removal etch is highly selective to the nitride spacers 105 to avoid the removal thereof. In one embodiment, the spacer pull-back etch employs a $CH_2F_2/Ar/O_2$ or $CHF_3/Ar/O_2$ chemistry, and is performed at a temperature of about 1-150° C. and a pressure of about 5-45 mTorr. Under such conditions, SiN-to-oxide etch selectivity of more than about 10:1 can be obtained. Other etch chemistries or techniques of pulling back the spacers 107 are also useful.

Figure 7:
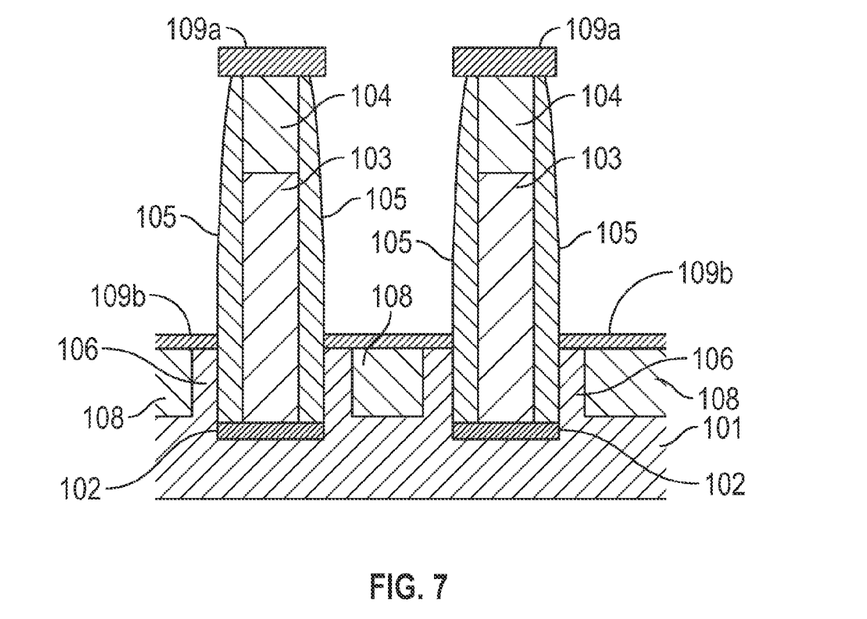

Thereafter, with reference to FIG. 7, a direction nitride liner is deposited over the gate structures (109a) and over the source/drain regions (109b). In one embodiment, the directional nitride liner 109a/109b can be formed using gas cluster ion beam (GCIB) deposition techniques. As is known in the art, GCIB are commonly used for etching, cleaning, smoothing, and forming thin films, such as the directional silicon nitride liner 109a/109b herein. For purposes of this discussion, gas clusters are nano-sized aggregates of materials that are gaseous under conditions of standard temperature and pressure. Such gas clusters may consist of aggregates including a few to several thousand molecules, or more, that are loosely bound together. The gas clusters can be ionized by electron bombardment, which permits the gas clusters to be formed into directed beams of controllable energy. Such cluster ions each typically carry positive charges given by the product of the magnitude of the electron charge and an integer greater than or equal to one that represents the charge state of the cluster ion. When growing a nitride such as $SiN_x$, a substrate including silicon or a silicon-containing material may be irradiated by a GCIB formed from a material source having a nitrogen-containing gas. For example, the material source may include $N_2$. In another example, the material source may include NO, $NO_2$, $N_2O$, or $NH_3$, or any combination of two or more thereof.

In another embodiment, the direction nitride liner 109a/109b can be formed using high density plasma (HDP) deposition techniques. As is known in the art, HDP deposition is a process used to deposit thin films, such as the directional silicon nitride liner 109a/109b herein, from a gas state (vapor) to a solid state on a substrate. Chemical reactions are involved in the process, which occur after creation of a plasma of the reacting gases. The plasma is generally created by RF (AC) frequency or DC discharge between two electrodes, the space between which is filled with the reacting gases. Plasma-deposited silicon nitride is formed from silane and ammonia or nitrogen, and typically includes a percentage of hydrogen as well. In yet another embodiment, plasma enhanced chemical vapor deposition (PECVD) could be employed in a manner than minimizes deposition of the silicon nitride liner on the sidewall spacers. For any embodiment, the directional silicon nitride liner 109a/109b is deposited to a thickness of about 2 nm to about 10 nm, for example about 5 nm.

Figure 8:
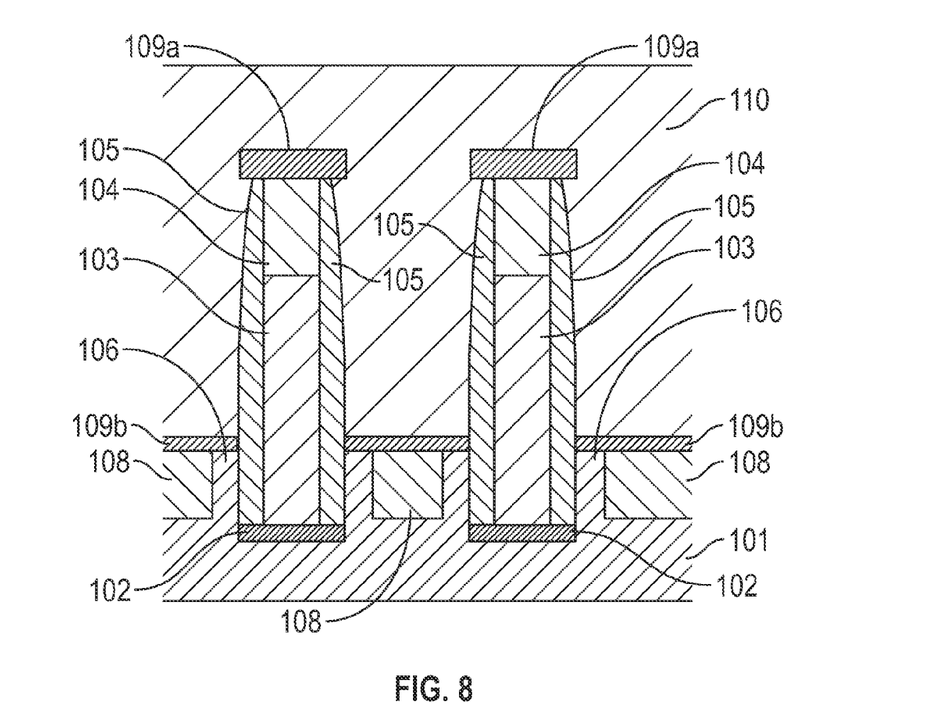

Continuing with the exemplary method, an interlayer dielectric (ILD) 110 is deposited over the substrate and the gates, as shown in FIG. 8. The ILD 110 can include silicon dioxide, fluorinated silicon dioxide, low-k dielectrics, such as porous low-k dielectrics, carbon-doped dielectric materials, organic polymers, inorganic polymers, blends of organic/inorganic polymers, and the like. The ILD 110 can be deposited using chemical vapor deposition methods (CVD), spin-on methods, or the like.

Figure 9:
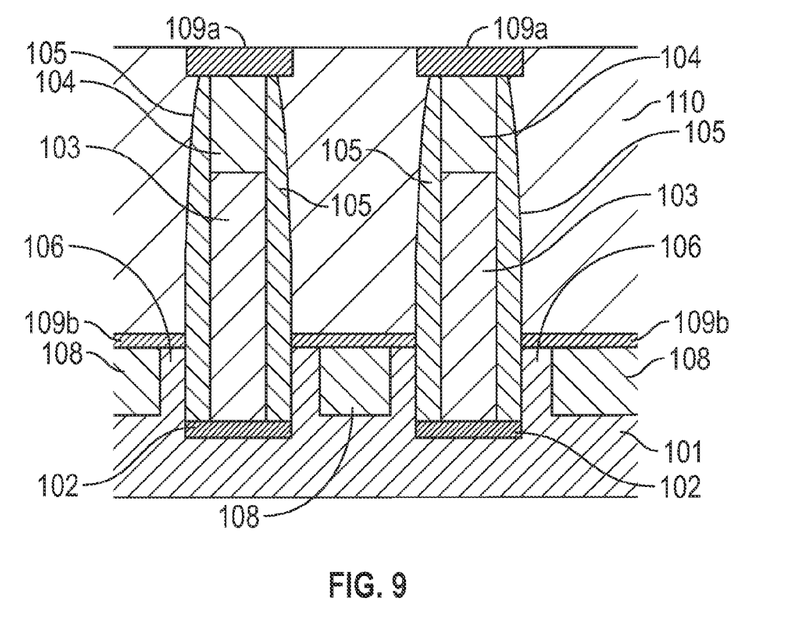

Thereafter, with reference to FIG. 9, the ILD 110 is polished until the directional silicon nitride liner 109a overlying the gate structures is reached. In one example, chemical mechanical planarization (CMP) may be employed to reduce the ILD layer 110. CMP typically requires the substrate to be attached to a carrier, a so-called polishing head, such that the substrate surface to be planarized is exposed and may be placed against a polishing pad. The polishing head and polishing pad are moved relative to each other usually by individually moving the polishing head and the polishing pad. Typically, the head and pad are rotated against each other while the relative motion is controlled to locally achieve a target material removal rate. During the polishing operation, typically a slurry that may include a chemically reactive agent and possibly abrasive particles is supplied to the surface of the polishing pad.

Figure 10:
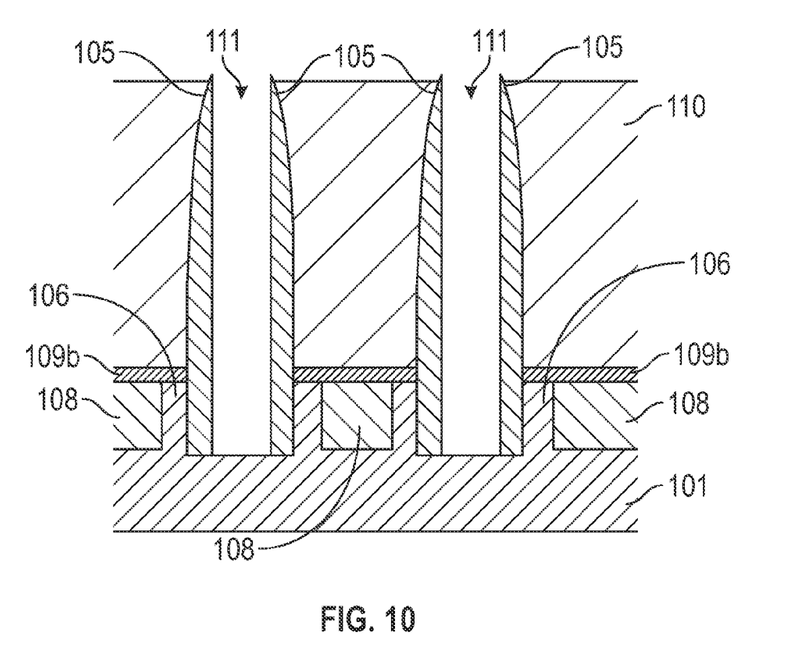

With reference now to FIG. 10, the directional nitride liner 109a, the dummy gate 103, and the hard mask 104 thereover are removed using a suitable dry etch or wet etch. The dummy gate 103 and the hard mask 104 are removed using an appropriate etchant chemistry that selectively etches the material used for the dummy gate 103 and the hard mask 104 (e.g., polycrystalline silicon/silicon nitride). In one embodiment, etching is performed in two steps, the first to etch the hard mask 104, and the second to etch the dummy gate 103. This selective etch has little or no effect on the other exposed device elements, including the spacers 105. The etchant chemistry, the etching conditions, the duration of the etching process, and other factors can be controlled as needed to ensure that the dummy gate 103 and the hard mask 104 are selectively removed in an efficient and effective manner. This etching forms trenches 111, as indicated in FIG. 10.

Figure 11:
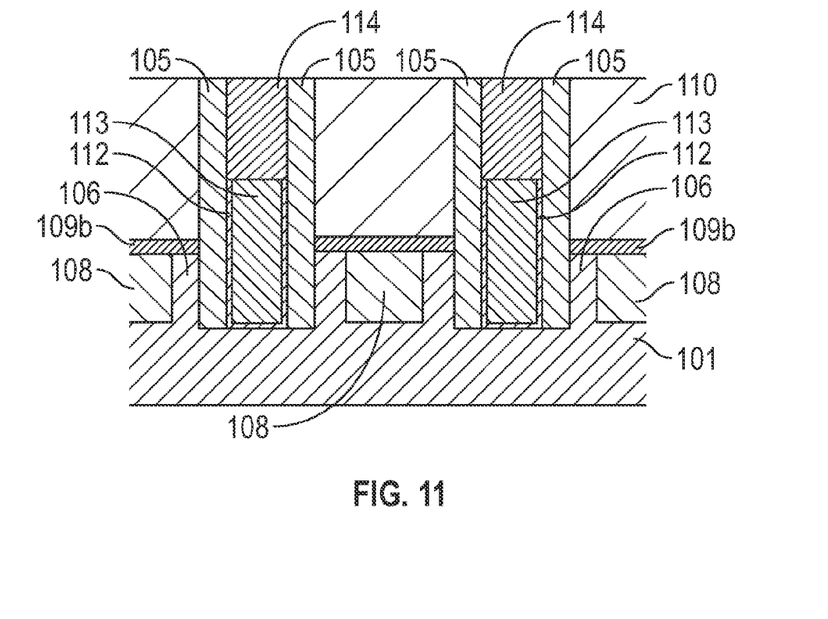

FIG. 11 depicts the formation of the replacement gate structures. In one embodiment, formation of the replacement gate structures begins with the deposition of a high-k material layer in the trenches 111 (not specifically illustrated). The high-k material layer can include a Hafnium (Hf) or Zirconium (Zr) oxide, or any other metal oxide with a sufficiently high dielectric constant as is well-known in the art. In an exemplary embodiment, the high-k material layer is $HfO_2$. The high-k material layer 106 can be deposited by any technique known in the art that provides for conformal deposition thereof in the trenches 105. In one embodiment, the high-k material 106 is deposited using atomic layer deposition (ALD).

Thereafter, one or more workfunction material layers 112 are deposited, patterned, and etched over the high-k layer, as shown in FIG. 11. Of course, any workfunction material layer may include two or more workfunction materials. The IC may include either n-type or p-type MOS transistors. Where a p-type MOS transistor is desired, any material with a workfunction that is on the p-side of the band-gap, and can be deposited using a process that provides for conformal deposition, for example ALD, may be used for layer 112. Where an n-type MOS transistor is desired, any material with a workfunction that is on the n-side of the band-gap, and can be deposited using a process that provides for conformal deposition, for example ALD, may be used for layer 112. Exemplary work function materials include TiN, TaN, TaC, and TiAlN, and combinations thereof.

Within the workfunction material layer 112 is formed a conductive metal layer 113 which is provided to decrease the line resistance in the replacement gate structure. Typical conductive metals that may be employed for layer 113 include, for example, aluminum, tungsten, or copper, or combinations thereof Along with the workfunction material layer 112, the conductive metal layer 113 is etched back within the trenches 111 so as to only partially fill the trenches 111.

Thereafter, as shown in FIG. 11, a further process step of depositing a capping layer 114 of, for example, silicon nitride is employed. The capping layer 114 fills the remaining portion of the trenches 111, thereby covering the layers 112 and 113 exposed therewithin. Silicon nitride, in one embodiment, can be deposited using plasma enhanced chemical vapor deposition (PECVD), although other techniques known in the art can be employed for filling and capping the trenches 111 with silicon nitride. Thereafter, chemical-mechanical planarization (CMP), as is known in the art, can be employed to reduce the height of the structures to a desired thickness.

Figure 12:
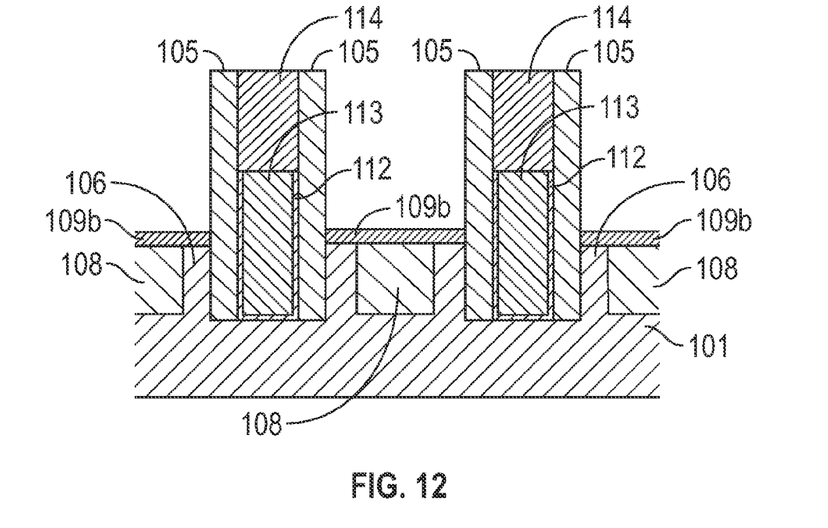
Figure 13:
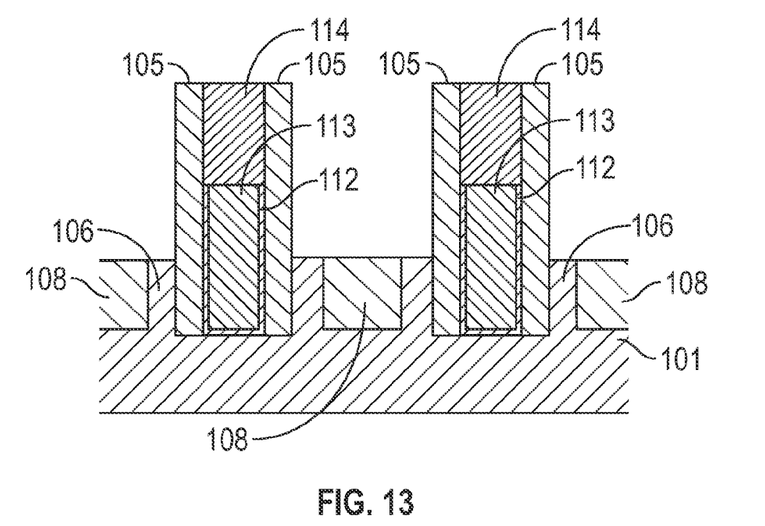

Continuing with the exemplary method, FIGS. 12 and 13 illustrate the etching and removal of the ILD layer 110 and the remaining directional silicon nitride liner 109b, respectively. The ILD layer 110 and the nitride liner 109b can be etched by, for example, an isotropic etch or alternatively reactive ion etching (RIE) using a suitable etching chemistry. In one embodiment, etching is performed in two steps, the first step for the ILD layer 110 using a chemistry suitable for etching oxides and the second step for the nitride liner 109b using a different chemistry suitable for etching nitrides.

Figure 14:
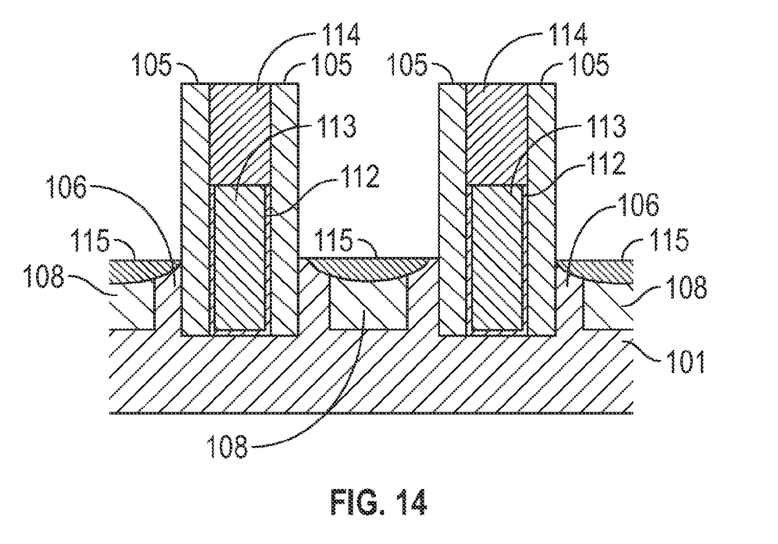

With reference now to FIG. 14, metal silicide regions 115 are formed over the source/drain regions 106. In one embodiment, a metal layer is formed over the device utilizing a deposition process including, but not limited to, sputtering, evaporation, plating, CVD, atomic layer deposition, or chemical solution deposition. The metal layer may be formed using any metal that is capable of forming a metal silicide when in contact with silicon and subjected to annealing. Suitable metals include, but are not limited to, nickel, cobalt, titanium, tungsten, molybdenum, tantalum, platinum, palladium, copper, and the like. In addition metal alloys may also be used. A capping layer, such as titanium nitride, may be provided over the metal layer to act as an oxygen diffusing barrier during the silicidation anneal. The thickness of the metal layer may range from about 5 nm to about 50 nm, depending on the particular metal chosen. Those of ordinary skill in the art are familiar with thickness ratios required to achieve full silicidation of the silicon material. The semiconductor device is thereafter subjected to an annealing process to convert the material of the silicon layer to a metal silicide 115. The particular form of silicide may vary depending on the metal selected and the characteristics of the annealing process. The temperature and time parameters of the anneal process may be controlled to form the intended silicide material and phase, as is known to those of ordinary skill in the art. The anneal process may be performed in a rapid thermal processing tool or a furnace, and the anneal time and temperature may vary. For example, the anneal time may range from 0 seconds for a spike anneal to 60 seconds in an RTP tool, while the anneal time in a furnace may range from 10-30 minutes. Temperatures for the anneal process may range from about 300-500° C. Following the completion of the silicide process, a material removal process, such as a wet etch may be performed to remove unreacted portions of the metal layer. For example, a sulfuric acid and $H_2O_2$ etch (SPM) followed by treatment with an APM solution including of $NH_4OH$, $H_2O_2$, and water may be used to remove the unreacted metal.

Figure 15:
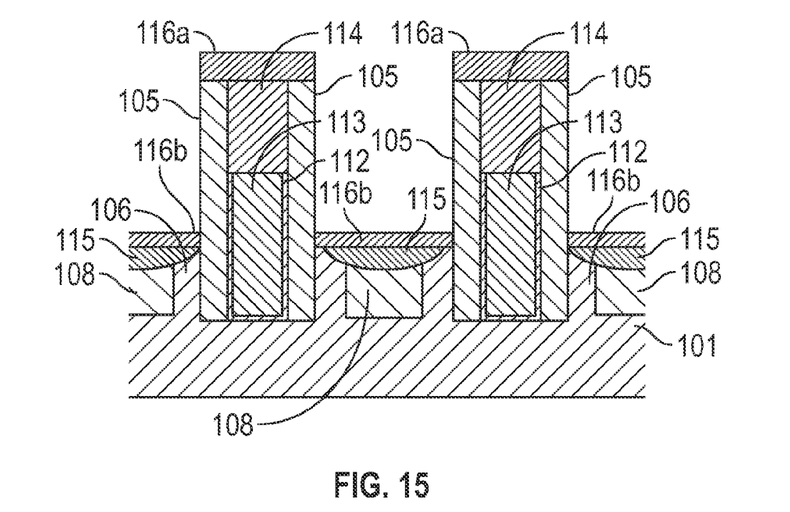

Thereafter, as shown in FIG. 15, another direction nitride liner is deposited over the gate structures (116a) and over the source/drain regions (116b). In one embodiment, the direction nitride liner 116a/116b can be formed using gas cluster ion beam (GCIB) deposition techniques, as discussed above. In another embodiment, the direction nitride liner 116a/116b can be formed using high density plasma (HDP) deposition techniques. In yet another embodiment, plasma enhanced chemical vapor deposition (PECVD) could be employed in a manner than minimizes deposition of the silicon nitride liner on the side wall spacers. For any embodiment, the directional silicon nitride liner 116a/116b is deposited to a thickness of about 10 nm to about 20 nm, for example about 15 nm.

Figure 16:
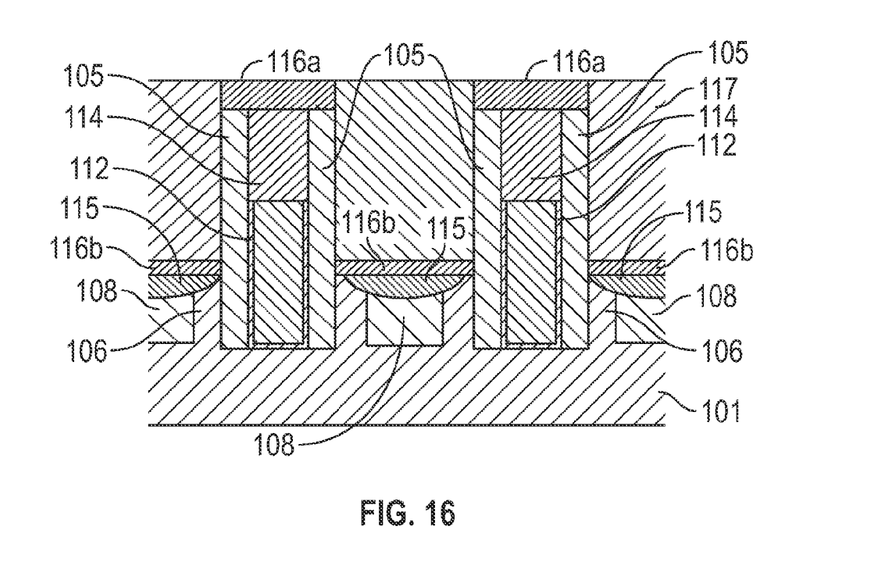
Figure 17:
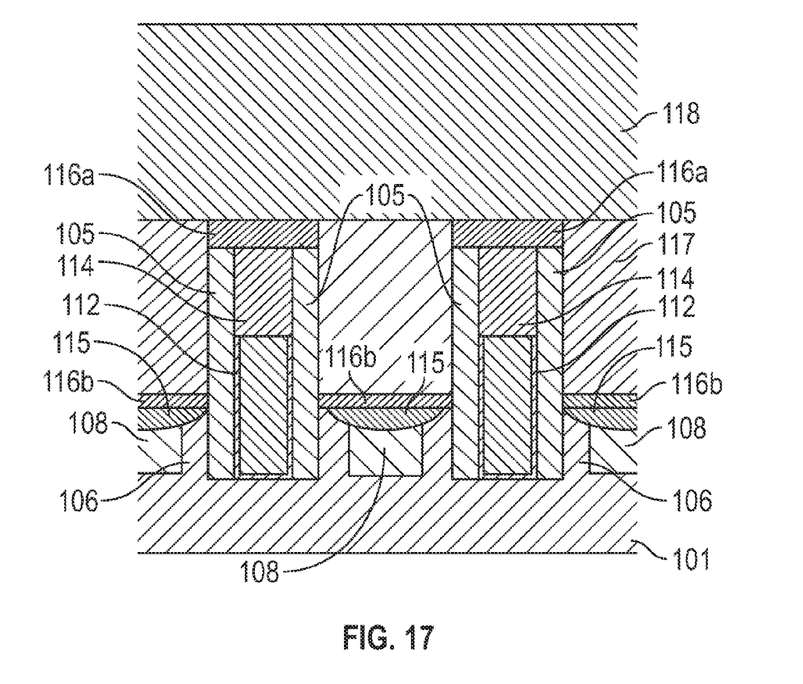

Continuing with the exemplary method, over the substrate and the gates is deposited another interlayer dielectric (ILD) 117, as shown in FIG. 16. The ILD 117 can include silicon dioxide, fluorinated silicon dioxide, low-k dielectrics, such as porous low-k dielectrics, carbon-doped dielectric materials, organic polymers, inorganic polymers, blends of organic/inorganic polymers, and the like. The ILD 117 can be deposited using chemical vapor deposition methods (CVD), spin-on methods, or the like. Thereafter, the ILD 117 is polished until the directional silicon nitride liner 116a overlying the gate structures is reached. In one example, chemical mechanical planarization (CMP) may be employed to reduce the ILD layer 117. Thereafter, as shown in FIG. 17, a blanket ILD layer 118 is deposited over the device. Any of the materials or techniques, as noted above, may be employed for this step.

Figure 18:
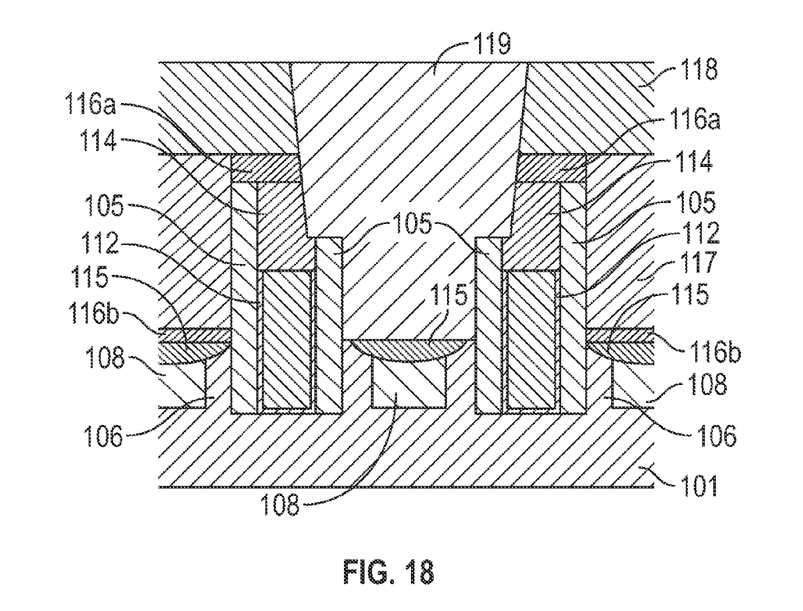

Finally, as illustrated in FIG. 18, a contact plug is formed to connect with the silicide region 115. For example, in one embodiment, a photolithographic sequence can be performed on the basis of well-established techniques, followed by anisotropic etch techniques and chemistries for forming contact openings in the layers 117 and 118. The etch process for forming the contact openings may be reliably controlled on the basis of using the silicide 115 as an etch stop layer. Electrical contact in the fabrication of semiconductor devices is realized with the formation of contact plugs 119, wherein etched openings extending through the interlayer dielectric (ILD) layer 117 and 118 are filled with a conductive material in order to electrically connect to the respective circuit element. The contact plugs 119 are typically formed of a tungsten-based metal, although other metals are possible. As such, as depicted in FIG. 18, at least a portion of the direction silicon nitride liner overlying the silicide region 116b is etched to allow for the connection between the contact plug 119 and the silicide region 115. Further, due to the tapered shape of the contact openings, a small portion of the silicon nitride liner overlying the replacement metal gate 116a will also be etched to form the contract plug 119.

Thereafter, further processing steps can be performed to fabricate the integrated circuit, as are well-known in the art. For example, further processing steps can include the formation of one or more patterned conductive layers across the device, connected with the contacts 119 and one or more via structures, with dielectric layers thereinbetween, among many others. The subject matter disclosed herein is not intended to exclude any subsequent processing steps to form and test the completed IC as are known in the art.

As such, the subject matter disclosed herein, in one embodiment, includes an integrated circuit fabrication technique for forming a replacement gate structure that has numerous advantages over techniques conventionally employed in the art. For example, the illustrated process flow offers a robust process flow to make a self-aligned contact suitable for use with a replacement metal gate process flow, and that is compatible with various gate structures. The presently described process flow offers a reduced fabrication burden for tight contact pitches with the use of directional silicon nitride deposition as the blocking nitride liner. For example, up to about 20 nm of space can be saved in between gate structures using the methods described herein. As such, this flow will allow for future scalability in replacement gate architectures that employ self-aligned contacts, particularly in architectures having less than or equal to about 64 nm of pitch between gate structures.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A method for fabricating an integrated circuit, comprising:
    forming a temporary gate structure on a semiconductor substrate, the temporary gate structure comprising a temporary gate material disposed between two spacer structures, the spacer structures comprising exposed exterior sidewalls opposite the temporary gate material;
    forming a first directional silicon nitride liner overlying the temporary gate structure and the semiconductor substrate, but not along at least a majority portion of the exposed exterior sidewalls of the two spacer structures;
    etching the first directional silicon nitride liner overlying the temporary gate structure and the temporary gate material to form a trench between the spacer structures, while leaving the directional silicon nitride liner overlying the semiconductor substrate in place;
    forming a replacement metal gate structure in the trench, the replacement metal gate structure comprising a work function material and a conductive material; and
    forming a contact adjacent to the replacement metal gate structure.

2. The method of claim 1, wherein forming the first directional silicon nitride liner comprises forming the first direction silicon nitride liner using GCIB nitride deposition.

3. The method of claim 1, wherein forming the first directional silicon nitride liner comprises forming the first direction silicon nitride liner using HDP nitride deposition.

4. The method of claim 1, wherein forming the first directional silicon nitride liner comprises forming the first direction silicon nitride liner using PECVD.

5. The method of claim 1, further comprising forming an interlayer dielectric over the first directional silicon nitride liner.

6. The method of claim 1, wherein forming the replacement metal gate structure comprises depositing a work function material comprising one or more of TiN, TaN, TaC, or TiAlN.

7. The method of claim 1, wherein forming the replacement metal gate structure comprises depositing a conductive material comprising one or more of Al, W, Co, or Cu.

8. A method for fabricating an integrated circuit, comprising:
    forming a temporary gate structure on a semiconductor substrate, the temporary gate structure comprising a temporary gate material disposed between two spacer structures;
    forming a first directional silicon nitride liner overlying the temporary gate structure and the semiconductor substrate;
    etching the first directional silicon nitride liner overlying the temporary gate structure and the temporary gate material to form a trench between the spacer structures, while leaving the directional silicon nitride liner overlying the semiconductor substrate in place;
    forming a replacement metal gate structure in the trench, the replacement metal gate structure comprising a work function material and a conductive material;
    etching the first directional silicon nitride liner overlying the semiconductor substrate after forming the replacement metal gate structure;
    forming a silicide region adjacent the replacement metal gate structure;
    forming a second directional silicon nitride liner overlying the replacement metal gate structure and the silicide region; and
    forming a contact to the silicide region by etching at least a portion of the second directional silicon nitride liner overlying the silicide region.

9. The method of claim 8, further comprising forming an interlayer dielectric over the first directional silicon nitride liner.

10. The method of claim 9, further comprising etching back the interlayer dielectric after forming the replacement metal gate structure.

11. The method of claim 9, wherein forming the contact to the silicide region further comprises etching at least a portion of the interlayer dielectric.

12. The method of claim 8, further comprising forming an interlayer dielectric overlying the second directional silicon nitride liner.

13. The method of claim 8, further comprising:
forming a second temporary gate structure on the semiconductor substrate;
forming the first directional silicon nitride liner overlying the second temporary gate structure;
etching the first directional silicon nitride liner overlying the second temporary gate structure;
replacing the temporary gate structure with a second replacement metal gate structure; and
forming the second direction silicon nitride liner over the second replacement gate structure.

14. The method of claim 13, wherein forming the silicide region comprises forming the silicide region adjacent the second replacement metal gate structure.

15. The method of claim 14, wherein forming the contact comprises forming the contact between the first and second replacement gate structures.

16. The method of claim 15, wherein the first and second replacement gate structures are formed at a pitch that is less than or equal to about 70 nm.

17. The method of claim 8, wherein forming the contact further comprises etching at least a first portion of the second silicon nitride liner overlying the replacement metal gate structure and leaving at least a second portion of the second silicon nitride liner overlying the replacement metal gate structure in place.

18. The method of claim 8, wherein forming the temporary gate structure comprises forming two sidewall spacers with a polysilicon temporary gate disposed therebetween.

19. The method of claim 8, wherein forming the replacement metal gate structure further comprises forming a capping material layer overlying the work function material and the conductive material.

* * * * *